(12) United States Patent
Hong et al.

(10) Patent No.: US 8,842,745 B2
(45) Date of Patent: Sep. 23, 2014

(54) TRANSMISSION UNIT ADOPTING A DIFFERENTIAL VOLTAGE DRIVING SYSTEM, TRANSMISSION UNIT AND RECEIVING UNIT SELECTIVELY ADOPTING A DIFFERENTIAL CURRENT DRIVING SYSTEM, DIFFERENTIAL VOLTAGE DRIVING SYSTEM, AND INTERFACE SYSTEM

(75) Inventors: Ju-Pyo Hong, Daejeon-si (KR); Jun-Ho Kim, Daejeon-si (KR); Jung-Hwan Choi, Daejeon-si (KR)

(73) Assignee: Silicon Works Co., Ltd., Daejeon-Si (KR)

( * ) Notice: Subject to any disclaimer, the term of this patent is extended or adjusted under 35 U.S.C. 154(b) by 393 days.

(21) Appl. No.: 13/142,409

(22) PCT Filed: Dec. 3, 2009

(86) PCT No.: PCT/KR2009/007194
§ 371 (c)(1),
(2), (4) Date: Jun. 27, 2011

(87) PCT Pub. No.: WO2010/076978
PCT Pub. Date: Jul. 8, 2010

(65) Prior Publication Data
US 2011/0268202 A1 Nov. 3, 2011

(30) Foreign Application Priority Data

Dec. 29, 2008 (KR) .................. 10-2008-0135785

(51) Int. Cl.
*H04L 27/00* (2006.01)
*H04L 25/02* (2006.01)
*H04L 7/00* (2006.01)
*H03K 19/0175* (2006.01)
*H04L 7/04* (2006.01)

(52) U.S. Cl.
CPC ........ *H04L 25/0272* (2013.01); *H04L 25/0282* (2013.01); *H04L 7/0091* (2013.01); *H03K 19/017581* (2013.01); *H04L 7/041* (2013.01)
USPC ............................ 375/259; 375/318; 375/309

(58) Field of Classification Search
USPC .......................................... 375/259, 318, 309
See application file for complete search history.

(56) References Cited

U.S. PATENT DOCUMENTS 5,126,974 A * 6/1992 Sasaki et al. .................. 365/207
6,281,715 B1 8/2001 DeClue et al.
(Continued)

FOREIGN PATENT DOCUMENTS

CN 1929305 3/2007
EP 1318601 6/2003
(Continued)

OTHER PUBLICATIONS

International Search Report of International application No. PCT/KR2009/007194 filed Dec. 3, 2009.
(Continued)

*Primary Examiner* — Michael Neff
(74) *Attorney, Agent, or Firm* — Kile Park Reed & Houtteman PLLC

(57) ABSTRACT

In the transmitter, receiver and interface system capable of selective adoption of a differential current driving scheme and a differential voltage driving scheme, a differential current driving scheme and a differential voltage driving scheme can be selectively adopted in one semiconductor chip depending upon the states of the transmission lines, so that effective data transmission is possible and common parts can be shared, whereby a design time can be shortened and a layout area can be reduced.

22 Claims, 6 Drawing Sheets

(56) References Cited

U.S. PATENT DOCUMENTS

2003/0087671 A1   5/2003  Ruha et al.
2009/0033365 A1*  2/2009  Miura .......................... 326/82

FOREIGN PATENT DOCUMENTS

| JP | 2005-223872 | 8/2005 |
| JP | 2006-262460 | 9/2006 |
| JP | 2006-311551 | 11/2006 |
| KR | 1020040053228 A | 6/2004 |
| KR | 1020060052668 A | 5/2006 |
| KR | 1020070008245 A | 1/2007 |
| KR | 10-0913528 | 8/2009 |
| TW | 200840206 | 10/2008 |
| WO | 2007102135 | 9/2007 |

OTHER PUBLICATIONS

Written Opinion of the International Searching Authority of International application No. PCT/KR2009/007194 filed Dec. 3, 2009.
International Preliminary Report on Patentability of International application No. PCT/KR2009/007194 filed Dec. 3, 2009.

* cited by examiner

TRANSMISSION UNIT ADOPTING A DIFFERENTIAL VOLTAGE DRIVING SYSTEM, TRANSMISSION UNIT AND RECEIVING UNIT SELECTIVELY ADOPTING A DIFFERENTIAL CURRENT DRIVING SYSTEM, DIFFERENTIAL VOLTAGE DRIVING SYSTEM, AND INTERFACE SYSTEM

BACKGROUND OF THE INVENTION

1. Field of the Invention

The present invention relates to a transmission and reception system of transmission lines, and more particularly, to a transmitter, a receiver and an interface system capable of selective adoption of a differential current driving scheme and a differential voltage driving scheme.

2. Description of the Related Art

In the conventional art, in order to transmit and receive data at a high speed, a differential current driving scheme in which currents of different magnitudes are transmitted through a pair of transmission lines and data is restored using a current difference between the two transmission lines has been mainly used.

In the differential current driving scheme, a transmitter generates currents of different magnitudes which correspond to data to be transmitted and transmits the currents through two transmission lines, and a receiver restores the data using a current difference between the currents flowing through the two transmission lines. In the differential current driving scheme, when compared to a single current driving scheme, while the distortion of transmitted signals by noise is not substantial, interference occurs between the transmission lines due to the physical positions of the two transmission lines and the parasitic resistance, parasitic inductance and parasitic capacitance of the two transmission lines.

Although two differential currents flowing from the transmitter to the receiver are based on the assumption that two current sources used for generating the two differential currents source or sink the same current value, in practice, different current values can result due to process deviations. Also, when the currents which are sourced or sunk by current sources disposed in the receiver are distorted by the noise introduced through the transmission lines, the qualities of differential current signals are degraded.

Summarizing this, the transmitted signals are likely to be distorted due to interference between the two transmission lines, and the time constants of the transmission lines increase to lengthen the transition times of the signals, whereby the transmission speeds of the signals cannot but deteriorate.

FIG. 1 is a view showing signals of a true line, which are outputted from a transmitter of a conventional differential current driving system.

Referring to FIG. 1, when the current sources for generating the two differential currents produce current values of different magnitudes due to the above-described reasons, it is to be appreciated that the magnitudes shift by a preset deviation a, that is, an offset, each time when the direction of the current applied to the true line is changed.

The conventional differential current driving scheme and the system for realizing the scheme are unstable because they have the above-described problems. Therefore, novel data transmission and reception methods free from these problems are keenly demanded in the art.

While research has actively been made for a transmitter, a receiver and an interface system using the transmitter and the receiver to solve the above-described problems, in the case of the conventional differential current driving scheme, since data is transmitted using a limited current source, if the loads of the transmission lines are substantial, distortion of signals is likely to occur.

SUMMARY OF THE INVENTION

Accordingly, the present invention has been made in an effort to solve the problems occurring in the related art, and an object of the present invention is to provide a differential voltage driving type transmitter which can transmit data to a receiver by controlling directions of voltage-type data applied to transmission lines.

Another object of the present invention is to provide a transmitter which has a voltage source and a current source and can selectively adopt a differential voltage driving scheme and a differential current driving scheme depending upon the states of transmission lines.

Another object of the present invention is to provide a receiver capable of selective adoption of a differential voltage driving scheme and a differential current driving scheme, which can restore data transmitted from a transmitter by detecting directions of voltages or currents applied to transmission lines.

Another object of the present invention is to provide an interface system capable of selective adoption of a differential voltage driving scheme and a differential current driving scheme, which can transmit and receive data by controlling directions of voltages or currents applied to transmission lines.

In order to achieve the above objects, according to one aspect of the present invention, there is provided a differential voltage driving type transmitter comprising a voltage source, a transmission direction selecting block, and an equalizing switch block. The voltage source sources a voltage to any one transmission line of a pair of transmission lines, or sinks a voltage from the other transmission line. The transmission direction selecting block transfers voltage-type data from the voltage source to any one transmission line of the pair of transmission lines, and transfers voltage-type data flowing through the other transmission line to the voltage source. The equalizing switch block initializes the pair of transmission lines into an equalized state.

In order to achieve the above objects, according to another aspect of the present invention, there is provided a transmitter capable of selective adoption of a differential voltage driving scheme and a differential current driving scheme, comprising a voltage source configured to source a voltage to a pair of transmission lines or sink a voltage from the pair of transmission lines; a current source configured to source a current to the pair of transmission lines or sink a current from the pair of transmission lines; a controller configured to generate enable signals for selectively enabling the voltage source and the current source; a transmission direction selecting block configured to source a voltage from the voltage source to any one transmission line of the pair of transmission lines and sink a voltage flowing through the other transmission line to the voltage source when the voltage source is enabled in response to the enable signal, and configured to source a current from the current source to any one transmission line of the pair of transmission lines and sink a current flowing through the other transmission line to the current source when the current source is enabled in response to the enable signal; and an equalizing switch block configured to initialize the pair of transmission lines into an equalized state.

In order to achieve the above objects, according to another aspect of the present invention, there is provided a receiver capable of selective adoption of a differential voltage driving scheme and a differential current driving scheme, suitable for receiving transmission signals from a pair of transmission lines, comprising a far end resistor having one terminal which is connected to a first transmission line and the other terminal which is connected to a second transmission line; and a differential amplifier configured to amplify a voltage difference between both terminals of the far end resistor. The far end resistor is used to have a variable value in conformity with a situation such as impedance matching.

In order to achieve the above objects, according to another aspect of the present invention, there is provided an interface system capable of selective adoption of a differential voltage driving scheme and a differential current driving scheme, comprising a transmitter for transmitting data through two transmission lines; and a receiver connected to the transmitter by way of the two transmission lines, wherein the transmitter is configured to control directions of voltages sourced to the two transmission lines or of currents flowing through the two transmission lines depending upon data to be transmitted, and wherein the receiver is configured to detect directions of the voltages sourced to the two transmission lines or of the currents flowing through the two transmission lines and restore the data.

BRIEF DESCRIPTION OF THE DRAWINGS

The above objects, and other features and advantages of the present invention will become more apparent after a reading of the following detailed description taken in conjunction with the drawings, in which.

DETAILED DESCRIPTION OF PREFERRED EMBODIMENTS

Figure 1:
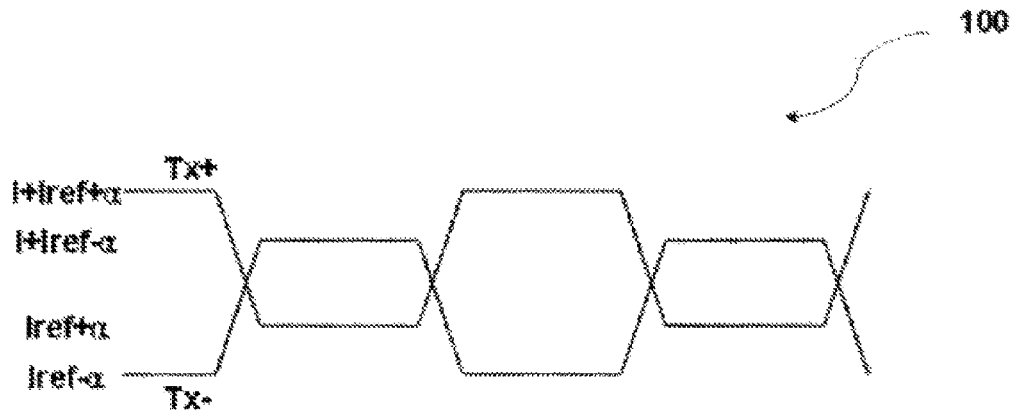
FIG. 1 is a view showing signals of a true line, which are outputted from a transmitter of a conventional differential current driving system.

Reference will now be made in greater detail to preferred embodiments of the invention, examples of which are illustrated in the accompanying drawings. Wherever possible, the same reference numerals will be used throughout the drawings and the description to refer to the same or like parts.

Figure 2:
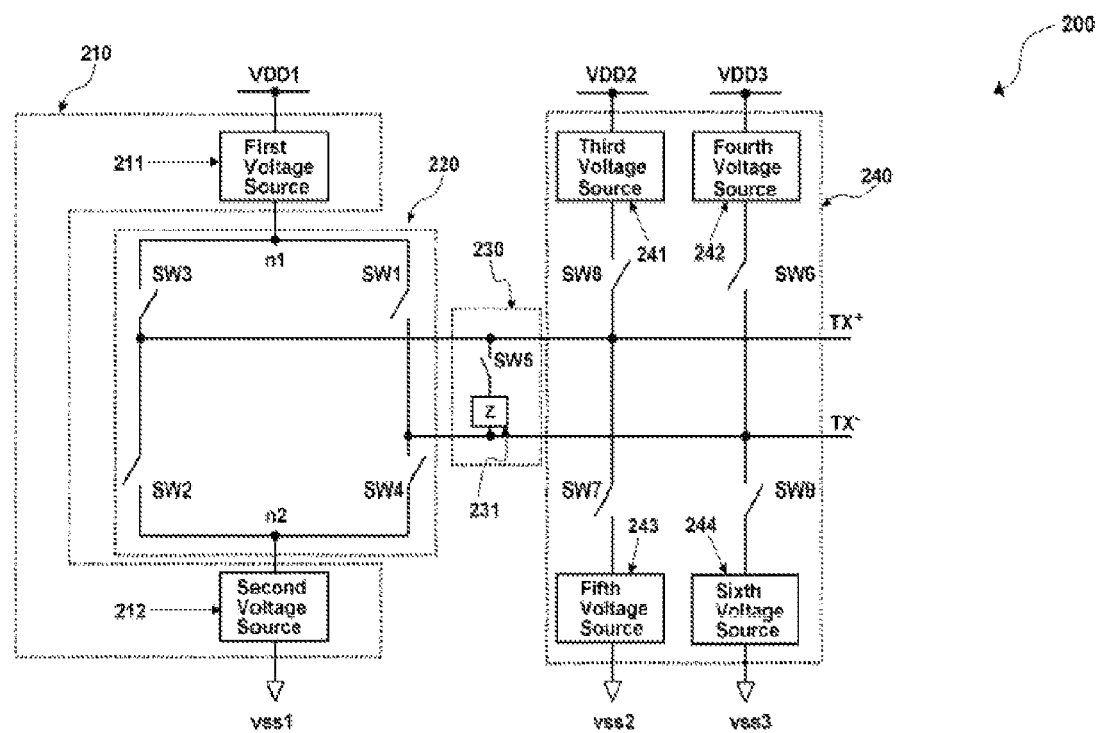
FIG. 2 is a circuit diagram illustrating a differential voltage driving type transmitter in accordance with an embodiment of the present invention.

FIG. 2 is a circuit diagram illustrating a differential voltage driving type transmitter in accordance with an embodiment of the present invention.

Referring to FIG. 2, a differential voltage driving type transmitter 200 includes a voltage source 210, a transmission direction selecting block 220, an equalizing switch block 230, and a pre-emphasis circuit 240.

The voltage source 210 comprises two voltage sources 211 and 212 which source voltages to a pair of transmission lines TX+ and TX− or sink voltages from the pair of transmission lines TX+and TX−. A first voltage source 211 has one terminal which is connected to a first voltage VDD1 and the other terminal which is connected to a first terminal n1 of the transmission direction selecting block 220, and sources a current of a preset magnitude to the first terminal n1.

A second voltage source 212 has one terminal which is connected to a second voltage VSS1 and the other terminal which is connected to a second terminal n2 of the transmission direction selecting block 220, and sinks a current of a preselected magnitude from the second terminal n2. It is the norm that the level of the first voltage VDD1 is higher than the level of the second voltage VSS1.

The transmission direction selecting block 220 transfers voltage-type data sourced from the first voltage source 211 to any one transmission line of the pair of transmission lines TX+ and TX−, and transfers voltage-type data flowing through the other transmission line of the pair of transmission lines TX+ and TX− to the second voltage source 212. The transmission direction selecting block 220 has four selection switches SW1 through SW4.

A first selection switch SW1 has one terminal which is connected to the first terminal n1 and the other terminal which is connected to a second transmission line TX−. A second selection switch SW2 has one terminal which is connected to the second terminal n2 and the other terminal which is connected to a first transmission line TX+. A third selection switch SW3 has one terminal which is connected to the first terminal n1 and the other terminal which is connected to the first transmission line TX+. A fourth selection switch SW4 has one terminal which is connected to the second terminal n2 and the other terminal which is connected to the second transmission line TX−.

A pair of the first selection switch SW1 and second selection switch SW2 and a pair of the third selection switch SW3 and fourth selection switch SW4 are simultaneously turned on or off. Turn-on and turn-off operations of the pair of the first selection switch SW1 and second selection switch SW2 are opposite to turn-on and turn-off operations of the pair of the third selection switch SW3 and fourth selection switch SW4. That is to say, if the pair of the first selection switch SW1 and second selection switch SW2 are turned on, the pair of the third selection switch SW3 and fourth selection switch SW4 are turned off. Conversely, if the pair of the third selection switch SW3 and fourth selection switch SW4 are turned on, the pair of the first selection switch SW1 and second selection switch SW2 are turned off.

The equalizing switch block 230 initializes the pair of transmission lines TX+ and TX− into an equalized state, and has an equalizing switch SW5 and a resistor component 231. The equalizing switch SW5 has one terminal which is connected to the first transmission line TX+ and the other terminal which is connected to the second transmission line TX−.

The resistor component 231 is disposed between the equalizing switch SW5 and the second transmission line TX−. While the resistor component 231 is disposed between the second transmission line TX− and the equalizing switch SW5 in FIG. 2, it can be envisaged that the resistor component 231 can be disposed between the first transmission line TX+ and the equalizing switch SW5. Also, the value of the resistor component 231 can be controlled from an outside (not shown).

The pre-emphasis circuit 240 sources or sinks voltages of predefined magnitudes to the pair of transmission lines TX+ and TX− before sourcing voltages from the voltage source 210 to the pair of transmission lines TX+ and TX− or sinking voltages from the pair of transmission lines TX+ and TX−.

The pre-emphasis circuit 240 includes four voltage sources 241 through 244 and four switches SW6 through SW9.

A third voltage source 241 has one terminal which is connected to a third voltage VDD2. A fourth voltage source 242 has one terminal which is connected to a fourth voltage VDD3. A fifth voltage source 243 has one terminal which is connected to a fifth voltage VSS2. A sixth voltage source 244 has one terminal which is connected to a sixth voltage VSS3.

A sixth switch SW6 has one terminal which is connected to the other terminal of the fourth voltage source 242 and the other terminal which is connected to the second transmission line TX−. A seventh switch SW7 has one terminal which is connected to the other terminal of the fifth voltage source 243 and the other terminal which is connected to the first transmission line TX+. An eighth switch SW8 has one terminal which is connected to the other terminal of the third voltage source 241 and the other terminal which is connected to the first transmission line TX+. A ninth switch SW9 has one terminal which is connected to the other terminal of the sixth voltage source 244 and the other terminal which is connected to the second transmission line TX−.

It is preferred that turn-on and turn-off cycles and turn-on resistance values of the selection switches SW1 through SW4 constituting the transmission direction selecting block 220 and the switches SW6 through SW9 constituting the pre-emphasis circuit 240 be designed to be different depending upon a system to be used.

Hereafter, the operations of the transmitter 200 shown in FIG. 2 will be described.

The key idea of the present invention resides in that the type of data to be transmitted is determined by the directions of the voltage-type data sourced to the two transmission lines TX+ and TX−.

When it is necessary to flow voltage-type data from the first transmission line TX+ to the second transmission line TX−, the third selection switch SW3 and the fourth selection switch SW4 are turned on, and the first selection switch SW1 and the second selection switch SW2 are turned off.

Conversely, when it is necessary to flow voltage-type data from the second transmission line TX− to the first transmission line TX+, the first selection switch SW1 and the second selection switch SW2 are turned on, and the third selection switch SW3 and the fourth selection switch SW4 are turned off.

In the present invention, the pre-emphasis circuit 240 is used to elevate a data transmission speed. When a voltage is sourced to the first transmission line TX+ and a voltage is sunk from the second transmission line TX− in the transmission direction selecting block 220, the eighth switch SW8 is turned on and an initial voltage is sourced to the first transmission line TX+. In order to further elevate the data transmission speed, the ninth switch SW9 is turned and an initial voltage is sunk from the second transmission line TX−.

Conversely, when a voltage is sourced to the second transmission line TX− and a voltage is sunk from the first transmission line TX+ in the transmission direction selecting block 220, the sixth switch SW6 is turned on and an initial voltage is sourced to the second transmission line TX−, and the seventh switch SW7 is additionally turned on and an initial voltage is sunk from the first transmission line TX+.

In the present invention, in the equalizing switch block 230, in addition to the equalizing switch SW5 which is used to initialize the pair of transmission lines TX+ and TX− into an equalized state, the resistor component 231 is used. This is to suppress electromagnetic interference that can occur at the moment when the pair of transmission lines TX+ and TX− enter the equalized state.

Figure 3:
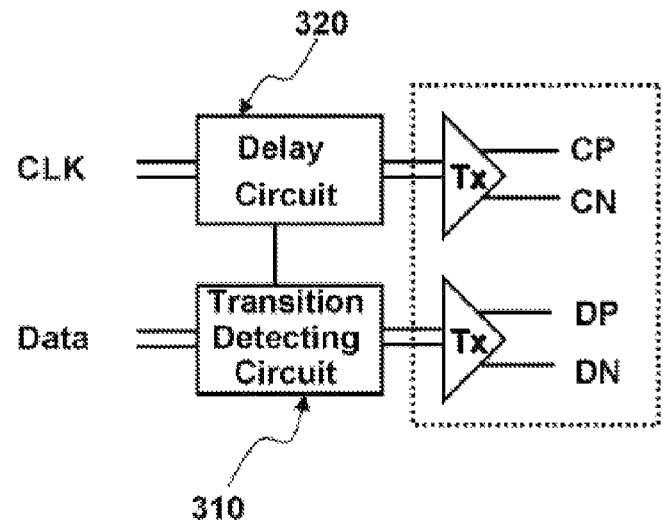
FIG. 3 is a view schematically illustrating one exemplary embodiment of a differential voltage driving type transmitter according to the present invention.
Figure 4:
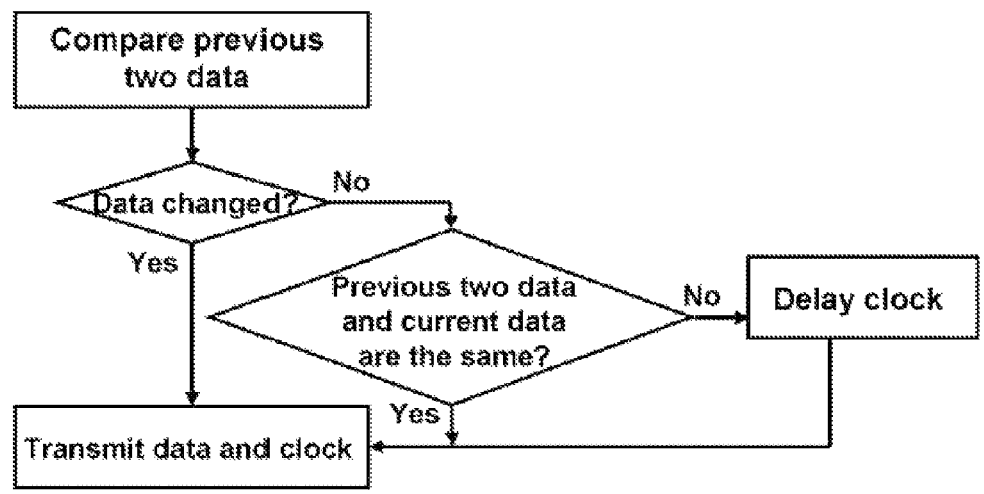
FIG. 4 is a flow chart illustrating operations of the one exemplary embodiment of a differential voltage driving type transmitter according to the present invention.
Figure 5:
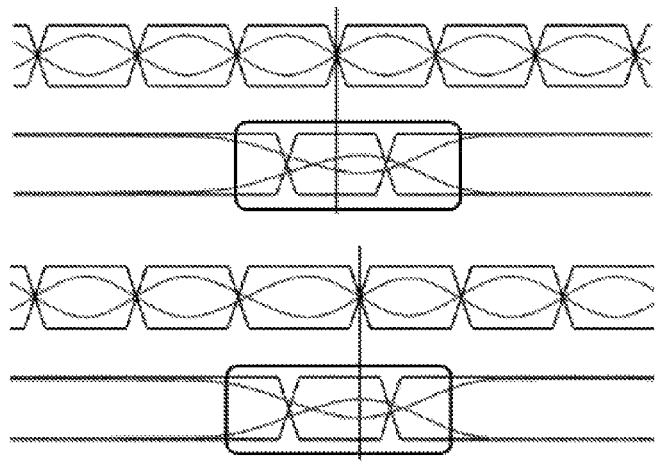
FIG. 5 is a view explaining a method for decreasing a timing error in the one exemplary embodiment of a differential voltage driving type transmitter according to the present invention.

FIG. 3 is a view schematically illustrating one exemplary embodiment of a differential voltage driving type transmitter according to the present invention, FIG. 4 is a flow chart illustrating operations of the one exemplary embodiment of a differential voltage driving type transmitter according to the present invention, and FIG. 5 is a view explaining a method for decreasing a timing error in the one exemplary embodiment of a differential voltage driving type transmitter according to the present invention.

Referring to FIG. 3, a differential voltage driving type transmitter 200 further includes a transition detecting circuit 310 configured to detect transitions of data transmitted to the pair of transmission lines and a delay circuit 320 configured to delay a clock as a result of detecting transitions of data in the transition detecting circuit 310.

In the case of transmitting data from a transmitter, timing of some data is likely to vary in a receiver due to the loads of the transmission lines. In particular, substantial amounts of delay are likely to be caused in a clock of which value changes every time and in data when the logic state of the data initially changes after the data is transmitted at the same logic state for a long time. Therefore, by detecting a transition of data in the transmitter and placing a delay in a clock or data depending upon an amount of transition, a timing error caused in a receiver can be decreased. One method of detecting a transition and placing a delay will be described below.

Referring to FIG. 4, two previous data are compared, and in the case where data change, data and a clock are transmitted as they are. If the two previous data do not change (transit), the two previous data and current data are compared. When the two previous data and the current data are the same, data and a clock are transmitted as they are, and when they are different, a delay is placed in a clock.

If a delay is not placed in a clock when the two previous data and the current data are different, timing is distorted in a receiver as can be readily seen from the waveforms illustrated above in FIG. 5. Therefore, in this case, by placing a delay in a clock through the delay circuit, the transition of a clock is positioned at the center portion of data as can be readily seen from the waveforms illustrated below in FIG. 5, whereby a timing error can be decreased.

Figure 6:
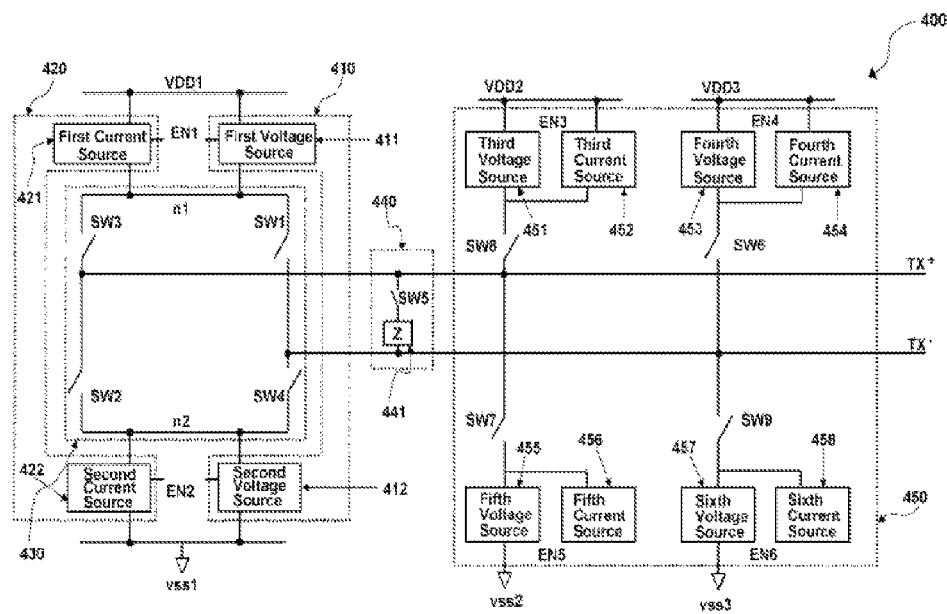
FIG. 6 is a circuit diagram of a transmitter capable of selective adoption of a differential current driving scheme and a differential voltage driving scheme in accordance with another embodiment of the present invention.

FIG. 6 is a circuit diagram of a transmitter capable of selective adoption of a differential current driving scheme and a differential voltage driving scheme in accordance with another embodiment of the present invention.

A transmitter 400 capable of selective adoption of a differential current driving scheme and a differential voltage driving scheme in accordance with another embodiment of the present invention includes a voltage source 410, a current source 420, a controller (not shown), a transmission direction selecting block 430, an equalizing switch block 440, and a pre-emphasis circuit 450.

The voltage source 410 includes a first voltage source 411 having one terminal which is connected to a first voltage VDD1 and the other terminal which is connected to a first terminal n1 of the transmission direction selecting block 430, and a second voltage source 412 having one terminal which is connected to a second voltage VSS1 and the other terminal which is connected to a second terminal n2 of the transmission direction selecting block 430.

The current source 420 includes a first current source 421 having one terminal which is connected to the first voltage VDD1 and the other terminal which is connected to the first terminal n1 of the transmission direction selecting block 430, and a second current source 422 having one terminal which is connected to the second voltage VSS1 and the other terminal which is connected to the second terminal n2 of the transmission direction selecting block 430.

The controller (not shown) generates enable signals EN1 and EN2 for selectively enabling the voltage source 410 and the current source 420.

The first voltage source 411 and the first current source 421 are selectively enabled in response to a first enable signal EN1, and the second voltage source 412 and the second current source 422 are selectively enabled in response to a second enable signal EN2.

If the first voltage source 411 and the second voltage source 412 are enabled in response to the first and second enable signals EN1 and EN2, the transmission direction selecting block 430 sources a voltage from the first voltage source 411 to any one transmission line of the pair of transmission lines TX+ and TX− and sinks a voltage flowing through the other transmission line to the second voltage source 412. Conversely, if the first current source 421 and the second current source 422 are enabled, the transmission direction selecting block 430 sources a current from the first current source 421 to any one transmission line of the pair of transmission lines TX+ and TX− and sinks a current flowing through the other transmission line to the second current source 422.

The transmission direction selecting block 430 has four selection switches SW1 through SW4. A first selection switch SW1 has one terminal which is connected to the first terminal n1 and the other terminal which is connected to a second transmission line TX−. A second selection switch SW2 has one terminal which is connected to the second terminal n2 and the other terminal which is connected to a first transmission line TX+. A third selection switch SW3 has one terminal which is connected to the first terminal n1 and the other terminal which is connected to the first transmission line TX+. A fourth selection switch SW4 has one terminal which is connected to the second terminal n2 and the other terminal which is connected to the second transmission line TX−.

A pair of the first selection switch SW1 and second selection switch SW2 and a pair of the third selection switch SW3 and fourth selection switch SW4 are simultaneously turned on or off. Turn-on and turn-off operations of the pair of the first selection switch SW1 and second selection switch SW2 are opposite to turn-on and turn-off operations of the pair of the third selection switch SW3 and fourth selection switch SW4. That is to say, if the pair of the first selection switch SW1 and second selection switch SW2 are turned on, the pair of the third selection switch SW3 and fourth selection switch SW4 are turned off. Conversely, if the pair of the third selection switch SW3 and fourth selection switch SW4 are turned on, the pair of the first selection switch SW1 and second selection switch SW2 are turned off.

The equalizing switch block 440 initializes the pair of transmission lines TX+ and TX− into an equalized state, and has an equalizing switch SW5 and a resistor component 441. The equalizing switch SW5 has one terminal which is connected to the first transmission line TX+ and the other terminal which is connected to the second transmission line TX−.

The resistor component 441 is disposed between the first transmission line TX+ and the equalizing switch SW5 or between the equalizing switch SW5 and the second transmission line TX−. It can be envisaged that the value of the resistor component 441 is controlled from an outside.

The pre-emphasis circuit 450 is used to efficiently implement data transmission. The pre-emphasis circuit 450 sources or sinks voltages or currents of predefined magnitudes to the pair of transmission lines TX+ and TX− before sourcing voltages or currents from the first voltage source 411 or the first current source 421 to the pair of transmission lines TX+ and TX− or sinking voltages or currents from the pair of transmission lines TX+ and TX− to the second voltage source 412 or the second current source 422.

The pre-emphasis circuit 450 includes four voltage sources, four current sources, and four switches SW6 through SW9.

A third voltage source 451 and a third current source 452 have one terminals which are connected to a third voltage VDD2. A fourth voltage source 453 and a fourth current source 454 have one terminals which are connected to a fourth voltage VDD3. A fifth voltage source 455 and a fifth current source 456 have one terminals which are connected to a fifth voltage VSS2. A sixth voltage source 457 and a sixth current source 458 have one terminals which are connected to a sixth voltage VSS3.

The voltage sources and current sources are selectively enabled in response to third through sixth enable signals EN3 through EN6 that are generated from the controller (not shown). Namely, in the case where the transmitter 400 according to the present invention need operate in a differential voltage driving scheme, the third voltage source 451 through the sixth voltage source 457 are enabled, and in the case where the transmitter 400 according to the present invention need operate in a differential current driving scheme, the third current source 452 through the sixth current source 458 are enabled.

A sixth switch SW6 has one terminal which is connected to the other terminals of the fourth voltage source 453 and fourth current source 454 and the other terminal which is connected to the second transmission line TX−. A seventh switch SW7 has one terminal which is connected to the other terminals of the fifth voltage source 455 and fifth current source 456 and the other terminal which is connected to the first transmission line TX+. An eighth switch SW8 has one terminal which is connected to the other terminals of the third voltage source 451 and third current source 452 and the other terminal which is connected to the first transmission line TX+. A ninth switch SW9 has one terminal which is connected to the other terminals of the sixth voltage source 457 and sixth current source 458 and the other terminal which is connected to the second transmission line TX−.

In the transmission direction selecting block 430, when it is necessary to source a voltage or a current to the first transmission line TX+ and sink a voltage or a current from the second transmission line TX−, the eighth switch SW8 is turned and an initial voltage or an initial current is sourced to the first transmission line TX+. At this time, in order to further increase a data transmission speed, the ninth switch SW9 is turned on such that an initial voltage or an initial current is sunk from the second transmission line TX−.

Conversely, in the transmission direction selecting block 430, when it is necessary to source a voltage or a current to the second transmission line TX− and sink a voltage or a current from the first transmission line TX+, the sixth switch SW6 is turned and an initial voltage or an initial current is sourced to the second transmission line TX−. At this time, in order to further increase a data transmission speed, the seventh switch SW7 is turned on such that an initial voltage or an initial current is sunk from the first transmission line TX+.

It is preferred that turn-on and turn-off cycles and turn-on resistance values of the selection switches SW1 through SW4 constituting the transmission direction selecting block 430 and the switches SW6 through SW9 constituting the pre-emphasis circuit 450 be designed to be different depending upon a system to be used.

It is preferred that even the transmitter capable selective adoption of a differential current driving scheme and a differential voltage driving scheme as shown in FIG. 6 include the transition detecting circuit and the delay circuit shown in FIGS. 3 through 5.

Since operations of the transition detecting circuit and the delay circuit are the same as described above with reference to FIGS. 3 through 5, detailed description thereof will be omitted herein.

Figure 7:
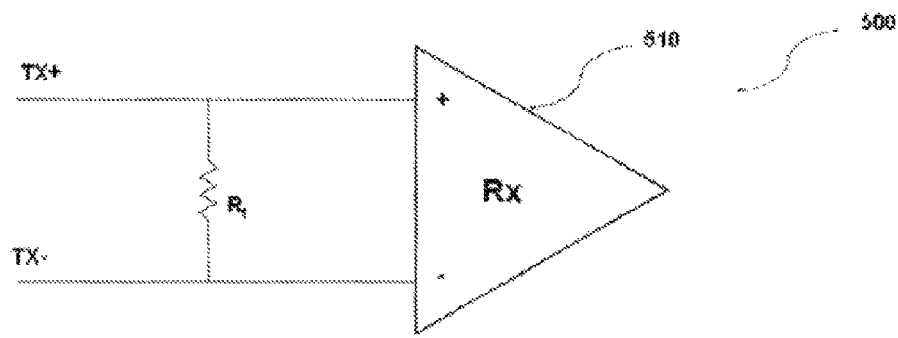
FIG. 7 is a circuit diagram of a receiver capable of selective adoption of a differential current driving scheme and a differential voltage driving scheme in accordance with another embodiment of the present invention.

FIG. 7 is a circuit diagram of a receiver capable of selective adoption of a differential current driving scheme and a differential voltage driving scheme in accordance with another embodiment of the present invention.

Referring to FIG. 7, a receiver 500 capable of selective adoption of a differential current driving scheme and a differential voltage driving scheme in accordance with another embodiment of the present invention includes a far end resistor $R_t$ and a differential amplifier 510. The far end resistor $R_t$ has one terminal which is connected to the first transmission line TX+ and the other terminal which is connected to the second transmission line TX−. The differential amplifier 510 amplifies a voltage difference between both terminals of the far end resistor $R_t$.

When the receiver 500 operates in a differential current driving scheme, a current flowing between the two transmission lines TX+ and TX− passes through the far end resistor $R_t$, and the voltages dropping at both terminals of the far end resistor $R_t$ vary depending upon a current flowing direction. Because a difference in voltages dropping at both terminals of the far end resistor $R_t$ is very small, it is preferred that the voltage difference be amplified by the differential amplifier 510.

Meanwhile, when the receiver 500 operates in a differential voltage driving scheme, a voltage generated in the transmitter is divided by the resistive loads of the transmission lines and the far end resistor $R_t$ of the receiver 500, and a voltage is generated in the receiver 500. This voltage is used by being amplified by the differential amplifier 510.

It is preferred that the far end resistor $R_t$ which is used in the receiver 500 be used to have a variable value in conformity with a situation such as impedance matching.

While numerous function blocks are actually employed in the receiver 500 capable of selective adoption of a differential current driving scheme and a differential voltage driving scheme shown in FIG. 7, only a minimum circuit used for detecting differential current signals or differential voltage-type data received through the two transmission lines TX+ and TX− is illustrated.

Figure 8:
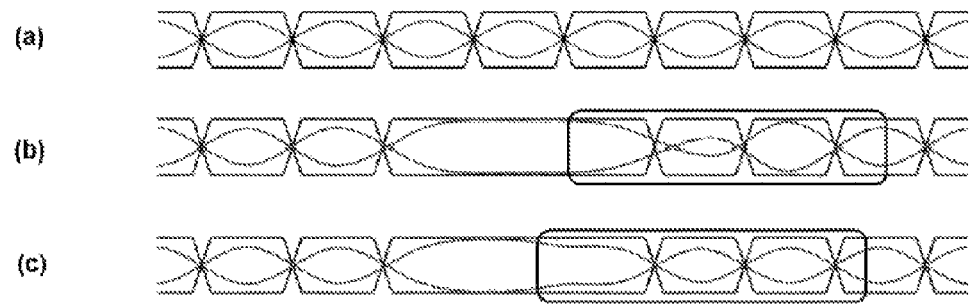
FIG. 8 is a view illustrating one exemplary embodiment of a method for controlling a timing error occurring in the receiver.

FIG. 8 is a view illustrating one exemplary embodiment of a method for controlling a timing error occurring in the receiver.

In general, when transmitting data from a transmitter, timing of some data varies in a receiver due to the loads of the transmission lines. In particular, substantial amounts of delay are likely to be caused in a clock of which value changes every time and in data when the logic state of the data initially changes after the data is transmitted at the same logic state for a long time.

Referring to FIG. 8(a), a clock that toggles at a high speed cannot attain a high swing level due to the loads of the transmission lines. Referring to FIG. 8(b), if data is constantly maintained without a transition, a swing level increases, and due to this fact, data that transits next has a low swing level, by which timing is distorted.

Therefore, as shown in FIG. 8(c), it is preferred that a transition of data be detected and the magnitude of a current flowing through the far end resistor be decreased depending upon an amount of the transition when the same data is inputted, so that a swing level becomes the same as a clock and timing is controlled to conform to a swing level of next data.

Figure 9:
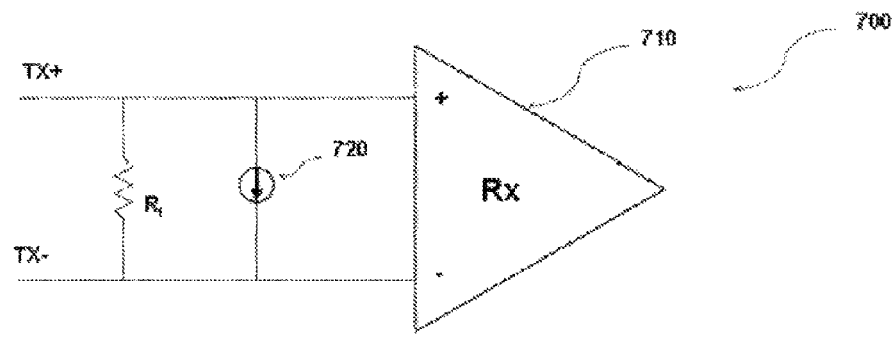
FIG. 9 is a circuit diagram of a receiver capable of controlling a timing error in accordance with another embodiment of the present invention.

FIG. 9 is a circuit diagram of a receiver capable of controlling a timing error in accordance with another embodiment of the present invention.

Referring to FIG. 9, a receiver 700 capable of selective adoption of a differential current driving scheme and a differential voltage driving scheme includes a far end resistor $R_t$, a differential amplifier 710, and a current source 720 for a current path. The far end resistor $R_t$ has one terminal which is connected to the first transmission line TX+ and the other terminal which is connected to the second transmission line TX−. The differential amplifier 710 amplifies a voltage difference between both terminals of the far end resistor $R_t$.

The current source 720 for a current path has one terminal which is connected to the first transmission line TX+ and the other terminal which is connected to the second transmission line TX−. As a result of comparing previous data and current data and detecting a transition of data, if the data is constantly maintained without a transition, the current source 720 for a current path is turned on so that a current flowing through the far end resistor $R_t$ can be reduced and timing of a clock and data can be controlled.

Figure 10:
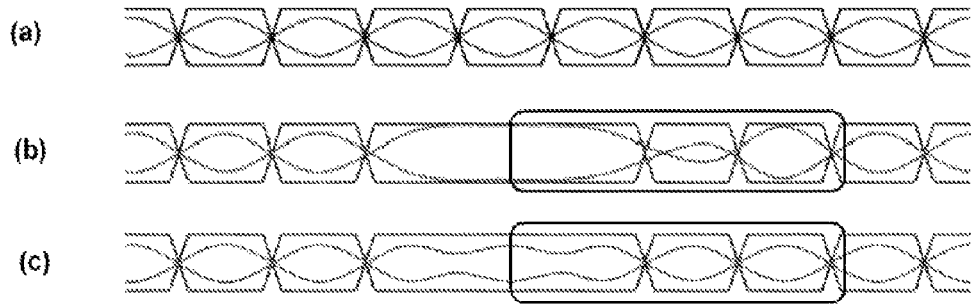
FIG. 10 is a view illustrating another exemplary embodiment of a method for controlling a timing error occurring in the receiver.
Figure 11:
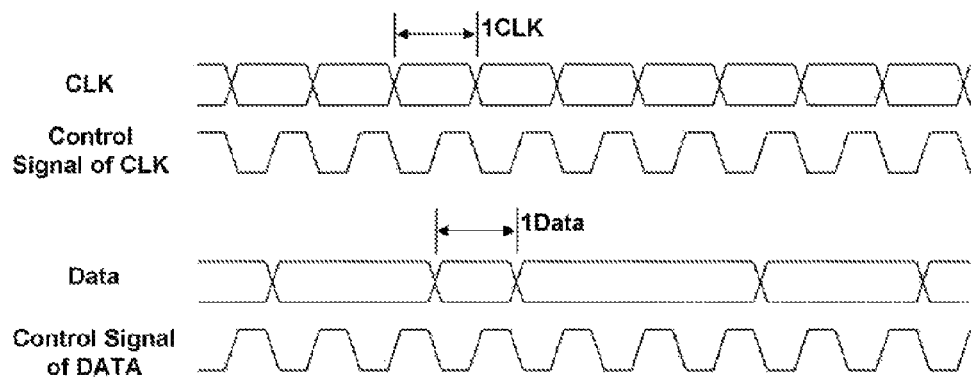
FIG. 11 is a view illustrating waveforms of a clock, data and control signals.

FIG. 10 is a view illustrating another exemplary embodiment of a method for controlling a timing error occurring in the receiver, and FIG. 11 is a view illustrating waveforms of a clock, data and control signals.

As aforementioned with reference to FIGS. 8(a) and 8(b), a clock that toggles at a high speed cannot attain a high swing level due to the loads of the transmission lines. If data is constantly maintained without a transition, a swing level increases, and due to this fact, data that transits next has a low swing level, by which timing is distorted (See FIGS. 10(a) and 10(b)).

In these cases, if constant data is inputted, in order to prevent a swing level from increasing, a resistive load of a predetermined magnitude is used for every data. If one data is maintained at the same logic state for a long time, a resistor is connected in parallel for a portion of a duration time of the data, and a resistive load of a small magnitude is used, whereby it is possible to prevent a waveform from being enlarged and timing from being distorted (see FIG. 10(c)).

At this time, in order to connect the resistor in parallel for a portion of a duration time of the data, a signal for controlling the connection is needed. In the present invention, a data control signal as shown in FIG. 11 is used.

In other words, when the logic of the data control signal is high, the resistor for controlling timing is connected in parallel so that the magnitude of the resistive load decreases, and when the logic of the data control signal is low, the resistor for controlling timing is not needed.

Figure 12:
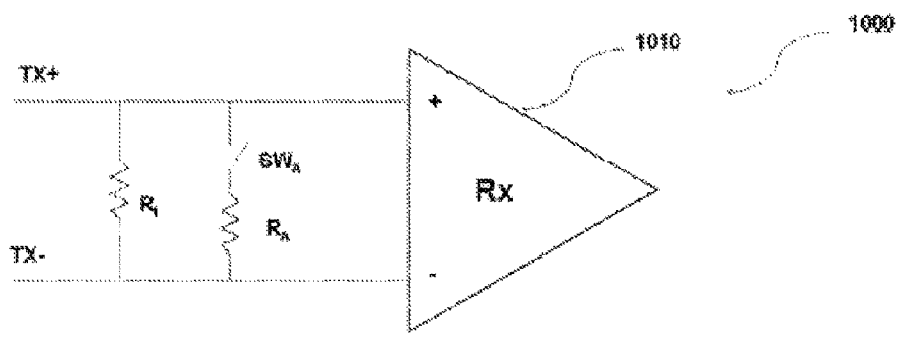
FIG. 12 is a circuit diagram of a receiver capable of controlling a timing error in accordance with another embodiment of the present invention.

FIG. 12 is a circuit diagram of a receiver capable of controlling a timing error in accordance with another embodiment of the present invention.

Referring to FIG. 12, a receiver 1000 capable of selective adoption of a differential current driving scheme and a differential voltage driving scheme includes a far end resistor $R_f$, a differential amplifier 1010, a timing control switch $SW_A$, and a timing controlling resistor component $R_A$. The far end resistor $R_f$ has one terminal which is connected to the first transmission line TX+ and the other terminal which is connected to the second transmission line TX−. The differential amplifier 1010 amplifies a voltage difference between both terminals of the far end resistor $R_f$.

The timing control switch $SW_A$ has one terminal which is connected to the first transmission line TX+ and the other terminal which is connected to the second transmission line TX−. The timing controlling resistor component $R_A$ is disposed between the first transmission line TX+ and the timing control switch $SW_A$ or between the timing control switch $SW_A$ and the second transmission line TX−.

As a result of detecting a transition of data, if one data is constantly maintained without a transition, the timing control switch $SW_A$ is turned on for a portion of a duration time of the one data such that the timing controlling resistor component $R_A$ is connected to the far end resistor $R_f$ in parallel, whereby it is possible to prevent a waveform of the one data from being enlarged and timing from being distorted.

Figure 13:
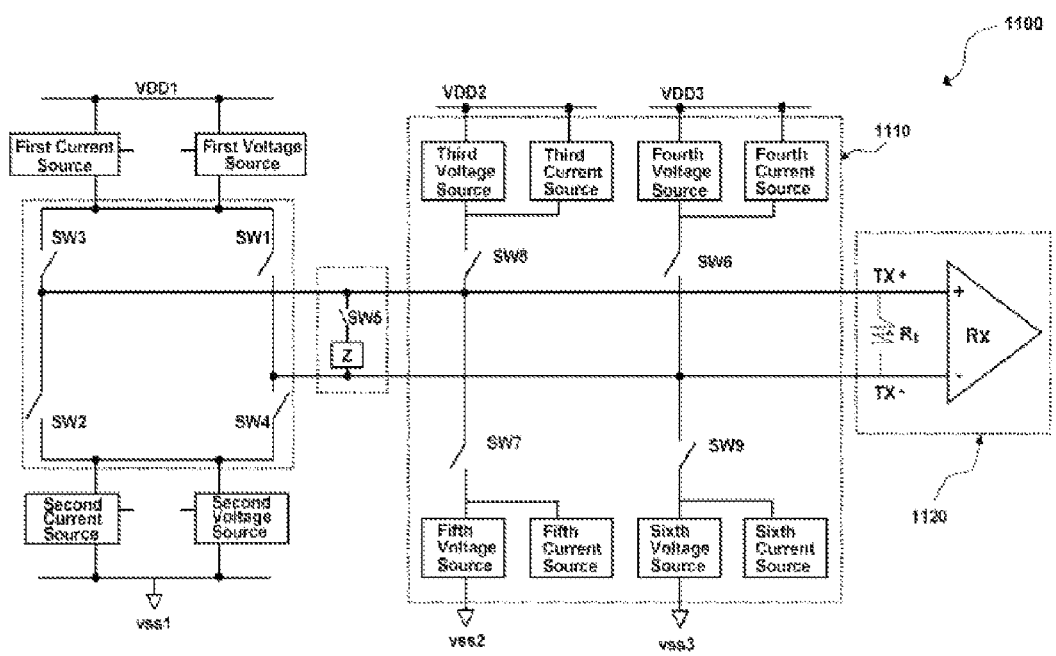
FIG. 13 is a circuit diagram illustrating an interface system capable of selective adoption of a differential current driving scheme and a differential voltage driving scheme in accordance with another embodiment of the present invention.

FIG. 13 is a circuit diagram illustrating an interface system capable of selective adoption of a differential current driving scheme and a differential voltage driving scheme in accordance with another embodiment of the present invention.

Referring to FIG. 13, an interface system 1100 capable of selective adoption of a differential current driving scheme and a differential voltage driving scheme in accordance with another embodiment of the present invention includes a transmitter 1110 for transmitting data through two transmission lines and a receiver 1120 connected to the transmitter 1110 by way of the two transmission lines.

The transmitter 1110 is configured to control directions of voltages sourced to the two transmission lines or of currents flowing through the two transmission lines depending upon data to be transmitted, and the receiver 1120 is configured to detect directions of the voltages sourced to the two transmission lines or of the currents flowing through the two transmission lines and restore the data.

Since the transmitter 1110 and the receiver 1120 shown in FIG. 13 correspond to those shown in FIGS. 2 through 12, detailed description thereof will be omitted herein.

As is apparent from the above description, in the differential voltage driving type transmitter according to the present invention, since limitations by current are avoided, even when the loads of transmission lines are substantial, it is possible to transmit data without distortion.

Also, in the transmitter, receiver and interface system capable of selective adoption of a differential current driving scheme and a differential voltage driving scheme, because a differential current driving scheme and a differential voltage driving scheme can be selectively adopted in one semiconductor chip depending upon the states of the transmission lines, effective data transmission is possible and common parts can be shared, so that a design time can be shortened and a layout area can be reduced.

Although preferred embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A differential voltage driving type transmitter comprising:
   a voltage source configured to source a voltage to any one transmission line of a pair of transmission lines and sink a voltage from the other transmission line;
   a transmission direction selecting block configured to transfer voltage-type data from the voltage source to any one transmission line of the pair of transmission lines and transfer voltage-type data flowing through the other transmission line to the voltage source; and
   an equalizing switch block configured to initialize the pair of transmission lines into an equalized state,
   the voltage source comprising:
      a first voltage source having one terminal which is connected to a first voltage and the other terminal which is connected to a first terminal of the transmission direction selecting block; and
      a second voltage source having one terminal which is connected to a second voltage and the other terminal which is connected to a second terminal of the transmission direction selecting block; and
   the equalizing switch block comprising:
      an equalizing switch having one terminal which is connected to a first transmission line and the other terminal which is connected to a second transmission line; and
      a resistor component disposed between the first transmission line and the equalizing switch or between the equalizing switch and the second transmission line, wherein a value of the resistor component can be controlled.

2. The differential voltage driving type transmitter according to claim 1, wherein the transmission direction selecting block comprises:
   a first selection switch having one terminal which is connected to the first terminal of the transmission direction selecting block and the other terminal which is connected to a second transmission line;
   a second selection switch having one terminal which is connected to the second terminal of the transmission direction selecting block and the other terminal which is connected to a first transmission line;
   a third selection switch having one terminal which is connected to the first terminal of the transmission direction selecting block and the other terminal which is connected to the first transmission line; and
   a fourth selection switch having one terminal which is connected to the second terminal of the transmission direction selecting block and the other terminal which is connected to the second transmission line.

3. The differential voltage driving type transmitter according to claim 1, further comprising:
   a pre-emphasis circuit configured to source or sink voltages of predefined magnitudes to or from the pair of transmission lines before sourcing voltages from the first voltage source to the pair of transmission lines or sinking voltages from the pair of transmission lines to the second voltage source.

4. The differential voltage driving type transmitter according to claim 3, wherein the pre-emphasis circuit comprises:
a third voltage source having one terminal which is connected to a third voltage;
a fourth voltage source having one terminal which is connected to a fourth voltage;
a fifth voltage source having one terminal which is connected to a fifth voltage;
a sixth voltage source having one terminal which is connected to a sixth voltage;
a sixth switch having one terminal which is connected to the other terminal of the fourth voltage source and the other terminal which is connected to a second transmission line;
a seventh switch having one terminal which is connected to the other terminal of the fifth voltage source and the other terminal which is connected to a first transmission line;
an eighth switch having one terminal which is connected to the other terminal of the third voltage source and the other terminal which is connected to the first transmission line; and
a ninth switch having one terminal which is connected to the other terminal of the sixth voltage source and the other terminal which is connected to the second transmission line.

5. The differential voltage driving type transmitter according to claim 4,
wherein, when a voltage is sourced to the first transmission line and a voltage is sunk from the second transmission line in the transmission direction selecting block, the eighth switch is turned on and an initial voltage is sourced to the first transmission line,
wherein, when a voltage is sourced to the second transmission line and a voltage is sunk from the first transmission line in the transmission direction selecting block, the sixth switch is turned on and an initial voltage is sourced to the second transmission line,
wherein, when a voltage is sourced to the first transmission line and a voltage is sunk from the second transmission line in the transmission direction selecting block, the ninth switch is turned on and an initial voltage is sunk from the second transmission line, and
wherein, when a voltage is sourced to the second transmission line and a voltage is sunk from the first transmission line in the transmission direction selecting block, the seventh switch is turned on and an initial voltage is sunk from the first transmission line.

6. The differential voltage driving type transmitter according to claim 1, further comprising:
a transition detecting circuit configured to detect transitions of data transmitted to the pair of transmission lines; and
a delay circuit configured to delay a clock as a result of detecting transitions of data in the transition detecting circuit.

7. The differential voltage driving type transmitter according to claim 6, wherein the delay circuit places a delay in a clock when, as a result of detecting transitions of data in the transition detecting circuit, at least two previous data do not change and current data are different from the at least two previous data.

8. A transmitter capable of selective adoption of a differential voltage driving scheme and a differential current driving scheme, comprising:
a voltage source configured to source a voltage to a pair of transmission lines or sink a voltage from the pair of transmission lines;
a current source configured to source a current to the pair of transmission lines or sink a current from the pair of transmission lines;
a controller configured to generate enable signals for selectively enabling the voltage source and the current source;
a transmission direction selecting block configured to source a voltage from the voltage source to any one transmission line of the pair of transmission lines and sink a voltage flowing through the other transmission line to the voltage source when the voltage source is enabled in response to the enable signal, and configured to source a current from the current source to any one transmission line of the pair of transmission lines and sink a current flowing through the other transmission line to the current source when the current source is enabled in response to the enable signal; and
an equalizing switch block configured to initialize the pair of transmission lines into an equalized state,
the voltage source comprising:
a first voltage source having one terminal which is connected to a first voltage and the other terminal which is connected to a first terminal of the transmission direction selecting block; and
a second voltage source having one terminal which is connected to a second voltage and the other terminal which is connected to a second terminal of the transmission direction selecting block, and
the current source comprising:
a first current source having one terminal which is connected to the first voltage and the other terminal which is connected to the first terminal of the transmission direction selecting block; and
a second current source having one terminal which is connected to the second voltage and the other terminal which is connected to the second terminal of the transmission direction selecting block.

9. The transmitter according to claim 8, wherein the transmission direction selecting block comprises:
a first selection switch having one terminal which is connected to the first terminal of the transmission direction selecting block and the other terminal which is connected to a second transmission line;
a second selection switch having one terminal which is connected to the second terminal of the transmission direction selecting block and the other terminal which is connected to a first transmission line;
a third selection switch having one terminal which is connected to the first terminal of the transmission direction selecting block and the other terminal which is connected to the first transmission line; and
a fourth selection switch having one terminal which is connected to the second terminal of the transmission direction selecting block and the other terminal which is connected to the second transmission line.

10. The transmitter according to claim 8, wherein the equalizing switch block comprises:
an equalizing switch having one terminal which is connected to the first transmission line and the other terminal which is connected to the second transmission line; and a resistor component disposed between the first transmission line and the equalizing switch or between the equalizing switch and the second transmission line, wherein a value of the resistor component can be controlled.

11. The transmitter according to claim 8, further comprising:

a pre-emphasis circuit configured to source or sink voltages or currents of predefined magnitudes to or from the pair of transmission lines before sourcing voltages or currents from the first voltage source or the first current source to the pair of transmission lines or sinking voltages or currents from the pair of transmission lines to the second voltage source or the second current source.

12. The transmitter according to claim 11, wherein pre-emphasis circuit comprises:

a third voltage source and a third current source having one terminals which are connected to a third voltage;

a fourth voltage source and a fourth current source having one terminals which are connected to a fourth voltage;

a fifth voltage source and a fifth current source having one terminals which are connected to a fifth voltage; and a sixth voltage source and a sixth current source having one terminals which are connected to a sixth voltage;

a sixth switch having one terminal which is connected to the other terminals of the fourth voltage source and fourth current source and the other terminal which is connected to the second transmission line;

a seventh switch having one terminal which is connected to the other terminals of the fifth voltage source and fifth current source and the other terminal which is connected to the first transmission line;

an eighth switch having one terminal which is connected to the other terminals of the third voltage source and third current source and the other terminal which is connected to the first transmission line; and a ninth switch having one terminal which is connected to the other terminals of the sixth voltage source and sixth current source and the other terminal which is connected to the second transmission line.

13. The transmitter according to claim 12, wherein, when a voltage or a current is sourced to the first transmission line and a voltage or a current is sunk from the second transmission line in the transmission direction selecting block, the eighth switch is turned on and an initial voltage or an initial current is sourced to the first transmission line, wherein, when a voltage or a current is sourced to the second transmission line and a voltage or a current is sunk from the first transmission line in the transmission direction selecting block, the sixth switch is turned on and an initial voltage or an initial current is sourced to the second transmission line, wherein, when a voltage or a current is sourced to the first transmission line and a voltage or a current is sunk from the second transmission line in the transmission direction selecting block, the ninth switch is turned on and an initial voltage or an initial current is sunk from the second transmission line, and wherein, when a voltage or a current is sourced to the second transmission line and a voltage or a current is sunk from the first transmission line in the transmission direction selecting block, the seventh switch is turned on and an initial voltage or an initial current is sunk from the first transmission line.

14. The transmitter according to claim 8, further comprising:

a transition detecting circuit configured to detect transitions of data transmitted to the pair of transmission lines; and a delay circuit configured to delay a clock as a result of detecting transitions of data in the transition detecting circuit.

15. The transmitter according to claim 14, wherein the delay circuit places a delay in a clock when, as a result of detecting transitions of data in the transition detecting circuit, at least two previous data do not change and current data are different from the at least two previous data.

16. A receiver capable of selective adoption of a differential voltage driving scheme and a differential current driving scheme, suitable for receiving transmission signals from a pair of transmission lines, comprising:

a far end resistor having one terminal which is connected to a first transmission line and the other terminal which is connected to a second transmission line; and a differential amplifier configured to amplify a voltage difference between both terminals of the far end resistor.

17. The receiver according to claim 16, wherein the receiver further comprises:

a current source for a current path having one terminal which is connected to the first transmission line and the other terminal which is connected to the second transmission line; and wherein, as a result of comparing previous data and current data and detecting a transition of data, if the data is constantly maintained without a transition, the current source for a current path is turned on so that a current flowing through the far end resistor is reduced.

18. The receiver according to claim 16, wherein the receiver further comprises:

a timing control switch having one terminal which is connected to the first transmission line and the other terminal which is connected to the second transmission line; and a timing controlling resistor component disposed between the first transmission line and the timing control switch or between the timing control switch and the second transmission line, and wherein, as a result of detecting a transition of data, if one data is constantly maintained without a transition, the timing control switch is turned on for a portion of a duration time of the one data such that the timing controlling resistor component is connected to the far end resistor in parallel.

19. An interface system capable of selective adoption of a differential voltage driving scheme and a differential current driving scheme, comprising:

a transmitter for transmitting data through two transmission lines;

a receiver connected to the transmitter by way of the two transmission lines;

a voltage source configured to source voltages to the two respective transmission lines or sink voltages from the two respective transmission lines;

a current source configured to source currents to the two respective transmission lines or sink currents from the two respective transmission lines; and a controller configured to generate enable signals for selectively enabling the voltage source and the current source;

wherein the transmitter is configured to control directions of voltages sourced to the two transmission lines or of currents flowing through the two transmission lines depending upon data to be transmitted, and wherein the receiver is configured to detect directions of the voltages sourced to the two transmission lines or of the currents flowing through the two transmission lines and restore the data.

20. The interface system according to claim 19, wherein the transmitter comprises:
a transmission direction selecting block configured to source a voltage from the voltage source to any one transmission line of the two transmission lines and sink a voltage flowing through the other transmission line to the voltage source when the voltage source is enabled in response to the enable signal, and configured to source a current from the current source to any one transmission line of the two transmission lines and sink a current flowing through the other transmission line to the current source when the current source is enabled in response to the enable signal; and
an equalizing switch block configured to initialize the two transmission lines into an equalized state.

21. The interface system according to claim 20, wherein the transmitter further comprises:
a pre-emphasis circuit configured to source or sink voltages or currents of predefined magnitudes to or from the two transmission lines before sourcing voltages or currents from the voltage source or the current source to the two transmission lines or sinking voltages or currents from the two transmission lines to the voltage source or the current source.

22. The interface system according to claim 19,
wherein the receiver comprises:
a far end resistor having one terminal which is connected to any one transmission line of the two transmission lines and the other terminal which is connected to the other transmission line, and
wherein data is restored by amplifying a voltage difference between the two transmission lines or a voltage difference between both terminals of the far end resistor that drops in correspondence to currents flowing through the two transmission lines.

* * * * *